US 8,427,855 B2

(12) United States Patent
Jang et al.

(10) Patent No.: US 8,427,855 B2
(45) Date of Patent: Apr. 23, 2013

(54) SEMICONDUCTOR NANOCRYSTAL COMPOSITE

(75) Inventors: Hyo Sook Jang, Seongnam-si (KR); Young Hwan Kim, Seongnam-si (KR); Eun Joo Jang, Suwon-si (KR); Shin Ae Jun, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 815 days.

(21) Appl. No.: 12/487,412

(22) Filed: Jun. 18, 2009

(65) Prior Publication Data

US 2010/0155744 A1    Jun. 24, 2010

(30) Foreign Application Priority Data

Dec. 22, 2008  (KR) .................. 10-2008-0130918

(51) Int. Cl.
*G11C 5/06* (2006.01)

(52) U.S. Cl.
USPC ............ 365/64; 365/174; 257/100; 257/433; 257/787; 257/791; 257/793; 977/744; 977/950

(58) Field of Classification Search .................. 257/100, 257/433, 787–791, 793, E23.119–E23.122, 257/E31.117, E33.059; 977/774, 950; 365/64, 365/174
See application file for complete search history.

(56) References Cited

U.S. PATENT DOCUMENTS

| | | | | |
|---|---|---|---|---|
| 2002/0002238 | A1* | 1/2002 | Laplante et al. | 525/50 |
| 2002/0045045 | A1 | 4/2002 | Adams et al. | |
| 2005/0085577 | A1* | 4/2005 | Ching et al. | 524/394 |
| 2006/0062937 | A1* | 3/2006 | Padiyath et al. | 428/1.33 |
| 2006/0105481 | A1 | 5/2006 | Boardman et al. | |
| 2007/0194676 | A1 | 8/2007 | Tanda et al. | |
| 2008/0246017 | A1* | 10/2008 | Gillies et al. | 257/13 |
| 2011/0079817 | A1* | 4/2011 | Ohara | 257/103 |

FOREIGN PATENT DOCUMENTS

| | | |
|---|---|---|
| JP | 2003309229 | 10/2003 |
| JP | 2008031190 | 2/2008 |
| JP | 2008179756 | 8/2008 |
| KR | 1020050110882 A | 11/2005 |
| KR | 1020070059066 A | 6/2007 |
| KR | 1020070084959 A | 8/2007 |
| KR | 1020070098307 A | 10/2007 |
| KR | 1020080003789 A | 1/2008 |
| KR | 1020080004372 A | 1/2008 |
| KR | 1020080040632 A1 | 5/2008 |
| KR | 1020080070865 A | 7/2008 |
| KR | 1020080074111 A | 8/2008 |

* cited by examiner

*Primary Examiner* — Vu Le
*Assistant Examiner* — Han Yang
(74) *Attorney, Agent, or Firm* — Cantor Colburn LLP

(57) ABSTRACT

A nanocrystal composite that includes a matrix including semiconductor nanocrystals, and a barrier layer disposed on at least a portion of the surface of the matrix and including a polymer with low oxygen permeability, low moisture permeability, or both.

12 Claims, 3 Drawing Sheets

SEMICONDUCTOR NANOCRYSTAL COMPOSITE

CROSS-REFERENCE TO RELATED APPLICATION

This application claims priority to Korean Patent Application No. 10-2008-130918, filed on Dec. 22, 2008, and all the benefits accruing therefrom under 35 U.S.C. §119, the contents of which in its entirety are herein incorporated by reference.

BACKGROUND

1. Field

The following description relates to a semiconductor nanocrystal composite.

2. Description of the Related Art

A semiconductor nanocrystal, also called a "quantum dot," is a crystalline semiconductor material having a size of a few nanometers. Quantum dots consist of several hundred to several thousand atoms. A semiconductor nanocrystal has a large surface area per unit volume and exhibits various effects (e.g., quantum confinement) due to its small size. These structural characteristics and effects account for unique physicochemical properties of the semiconductor nanocrystal, which are different from those inherent to the constituent semiconductor materials. Particularly, the photoelectronic properties of the nanocrystals can be controlled by varying the size of the nanocrystals. Research efforts are being directed towards the development of nanocrystals applicable to a variety of electronic devices, including display devices such as bioluminescent display devices. Semiconductor nanocrystals free of heavy metals possess many advantages as luminescent materials because of their environmental friendliness and safety in humans. Many techniques for controlling the size, structure and uniformity of semiconductor nanocrystals are currently being developed in order to utilize excellent characteristics and broad applicability of the semiconductor nanocrystals.

A semiconductor nanocrystal composite refers to a structure in which semiconductor nanocrystals are contained in a matrix composed of a polymeric or inorganic material. The semiconductor nanocrystals are likely to be defective or oxidized, which degrades their inherent characteristics, when exposed to external factors such as oxygen or moisture. Further, an acid or a base catalyst and functional groups included in the organic material for the matrix may adversely affect the inherent characteristics of the semiconductor nanocrystals in the preparation of the semiconductor nanocrystal composite.

SUMMARY

Disclosed herein is a nanocrystal composite that includes a matrix including semiconductor nanocrystals, and a barrier layer disposed on at least a portion of the surface of the matrix and including a polymer with low oxygen permeability, low moisture permeability or both.

In exemplary embodiments, the polymer is transparent, hydrophobic or both. In one exemplary embodiment, the polymer is transparent and hydrophobic. In one exemplary embodiment, the polymer has an oxygen permeability of not higher than about 10,000 milliliters per square meter per day ($mL/m^2/day$) at a relative humidity of 0%, or not higher than about 100,000 $mL/m^2/day$ at a relative humidity of 90%. In one exemplary embodiment, the polymer has a moisture permeability of not higher than about 10,000 grams per square meter per day ($g/m^2/day$) at a relative humidity of 90%.

In one exemplary embodiment, the polymer is prepared by polymerizing one or more monomers. In one exemplary embodiment, the polymer is selected from the group consisting of polyolefins, polyesters, polyamides, polyvinyl chlorides, polyvinyl alcohols, polyvinylidene chlorides, polystyrenes, polyacrylates, ethylene-vinyl alcohol copolymers, ethylene-vinyl chloride copolymers, vinylidene chloride-styrene copolymers, vinylidene chloride-vinyl chloride copolymers, copolymers thereof, and mixtures thereof.

In one exemplary embodiment, the barrier layer has a thickness of about 10 nanometers (nm) to about 100 micrometers (μm).

In one exemplary embodiment, the nanocrystal composite further includes at least one functional layer disposed under at least a portion of the barrier layer. In one exemplary embodiment, the functional layer includes an adhesive polymer. In one exemplary embodiment, the adhesive polymer is selected from the group consisting of polyethylene, polypropylene, polystyrene, a copolymer thereof, and a mixture thereof. In one exemplary embodiment, the sum of the thicknesses of the barrier layer and the functional layer is between about 10 nm and about 100 μm.

Also disclosed herein is an electronic device that includes the nanocrystal composite.

Also disclosed herein is a color converting light emitting device including a light emitting diode and the nanocrystal composite. In one exemplary embodiment, the light emitting diode emits light in the blue or the ultraviolet ("UV") region.

BRIEF DESCRIPTION OF THE DRAWINGS

The above and other aspects, advantages, and features of this disclosure will become more apparent by describing in further detail exemplary embodiments thereof with reference to the attached drawings, in which.

DETAILED DESCRIPTION

Figure 1:
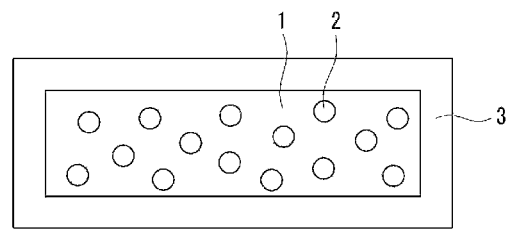
FIG. 1 is a cross-sectional view illustrating an exemplary embodiment of a nanocrystal composite.

This disclosure now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

The terminology used herein is for the purpose of describing particular embodiments only and is not intended to limit the claims. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

All methods described herein can be performed in a suitable order unless otherwise indicated herein or otherwise clearly contradicted by context. The use of any and all examples, or exemplary language (e.g., "such as"), is intended merely for illustration and does not pose a limitation on the scope of the disclosure unless otherwise claimed. No language in the specification should be construed as indicating any non-claimed element as essential.

Hereinafter, the present invention will be described in detail with reference to the accompanying drawings.

An exemplary embodiment of a nanocrystal composite will now be described in detail with reference to FIG. 1. Referring to FIG. 1, the nanocrystal composite includes a matrix 1 containing semiconductor nanocrystals 2, and a barrier layer 3. The barrier layer 3 is disposed on at least a portion of the surface of the matrix 1 and includes a polymer with low oxygen permeability, low moisture permeability or both. In one exemplary embodiment, the barrier layer 3 is formed on at least a portion of the surface of the matrix 1 and contains a polymer with low oxygen permeability, low moisture permeability or both. In this exemplary embodiment, the barrier layer 3 is formed separately from the matrix 1 prior to coating the matrix 1. Therefore, the matrix 1 does not undergo any chemical reactions, such as oxidation or reduction that may reduce the stability or lifetime of the display device. The barrier layer 3 is able to prevent oxygen, moisture, or both from permeating into the matrix 1 because it contains a polymer having low oxygen permeability, low moisture permeability or both. The ability of the barrier layer 3 to prevent oxygen, moisture, or both from permeating into the matrix 1 ensures good stability and a long lifetime for a display device to which the nanocrystal composite is applied.

In one exemplary embodiment, the barrier layer 3 may surround the entire surface of the matrix 1. In one exemplary embodiment, the barrier layer 3 may surround only a portion of the surface of the matrix 1. In one exemplary embodiment, the barrier layer 3 may surround only a portion of the surface of the matrix 1 that is in contact with oxygen, moisture, or both. Even when the barrier layer 3 surrounds only a portion of the surface of the matrix 1, the matrix 1 is effectively protected from the outside. Although the barrier layer 3 is formed on only a portion of the surface of the matrix 1 or on only a portion of the surface of the matrix 1 that is in contact with oxygen, moisture or both; the matrix 1 is protected to some extent from the penetration of oxygen, moisture, or both through the surface thereof. That is, the nanocrystal composite that includes the barrier layer 3 shows better oxygen barrier properties, moisture barrier properties or both than a nanocrystal composite that does not include a barrier layer.

In one exemplary embodiment, the polymer may be transparent and hydrophobic, and is capable of effectively preventing the permeation of oxygen, moisture, or both into the matrix 1.

In one exemplary embodiment, the polymer may have an oxygen permeability of not higher than about 10,000 mL/m²/day at a relative humidity of 0% or not higher than about 100,000 mL/m²/day at a relative humidity of 90%. The low oxygen permeability of the polymer allows it to more efficiently prevent oxygen from permeating into the matrix 1. The oxygen permeability of the polymer at a relative humidity of 0% is measured at a temperature of about 20 degrees Celsius (° C.). The oxygen permeability of the polymer at a relative humidity of 90% is measured at a temperature of 23° C.

In one exemplary embodiment, the polymer may have a moisture permeability of not higher than about 10,000 g/m²/day at a relative humidity of 90%. The low moisture permeability of the polymer allows it to more efficiently prevent moisture from permeating into the matrix 1. The moisture permeability of the polymer at 90% relative humidity is measured at a temperature of 38° C.

In one exemplary embodiment, the polymer may be a homopolymer or a copolymer. Examples of the homopolymer include polyolefins, such as polyethylene and polypropylene; polyesters, such as polyethylene terephthalate, polymethylene terephthalate and polybutylene terephthalate; polyamides, such as nylon; polyvinyl chlorides; polyvinyl alcohols; polyvinylidene chlorides; polystyrenes and any mixture thereof. The use of high-density polyethylene as the polymer results in a considerable reduction in the moisture permeability, oxygen permeability, or both of the barrier layer 3. Examples of the copolymer include ethylene-vinyl alcohol copolymers, ethylene-vinyl chloride copolymers, vinylidene chloride-styrene copolymers, vinylidene chloride-vinyl chloride copolymers and mixtures thereof. Any combination of the aforementioned polymers and copolymers may also be used.

In one exemplary embodiment, the barrier layer 3 may have a thickness of about 10 nm to about 100 μm.

In one exemplary embodiment, the nanocrystal composite may further include at least one functional layer formed under at least a portion of the barrier layer. In one exemplary embodiment, the functional layer may contain an adhesive polymer. The adhesive polymer reinforces the adhesion between the barrier layer 3 and the matrix 1 to prevent the barrier layer 3 from being separated from the matrix 1, thereby achieving enhanced oxygen barrier properties, moisture barrier properties or both. In one exemplary embodiment, when the barrier layer 3 is composed of a hydrophilic polymer, the functional layer may contain a transparent and hydrophobic polymer. In this exemplary embodiment, the oxygen and moisture barrier properties of the barrier layer 3 may be enhanced.

In one exemplary embodiment, the adhesive polymer may be polyethylene, polypropylene, a copolymer thereof, or a mixture thereof.

In one exemplary embodiment, the functional layer may consist of two or more sub-layers. In one exemplary embodiment, the functional layer may be disposed in at least a portion of the interface between the barrier layer 3 and the matrix 1 to effectively adhere the barrier layer 3 to the matrix 1. In one exemplary embodiment, the functional layer may be disposed at the entire interface between the barrier layer 3 and the matrix 1 to further effectively adhere the barrier layer 3 to the matrix 1.

In one exemplary embodiment, the sum of the thicknesses of the barrier layer 3 and the functional layer is from about 10 nm to about 100 μm. Within this thickness range, the barrier layer 3 or the functional layer can be continuously formed on the matrix 1 such that the semiconductor nanocrystals 2 contained in the matrix 1 are able to optimally perform.

In one exemplary embodiment, the matrix 1 may contain an organic material, an inorganic material, or both. Examples of the organic material include polysiloxane, epoxy, polyacrylate, and any mixture thereof. Examples of the inorganic material include silica, zirconia, and any mixture thereof.

The matrix may be a mixture or composite of two or more of the foregoing organic and inorganic materials. For example, the matrix may be a composite composed of the nanocrystals and a polysiloxane that is contained in an organic or inorganic material.

In one exemplary embodiment, the semiconductor nanocrystals may be selected from the group consisting of, but are not limited to, Group II-VI semiconductor compounds, Group II-V semiconductor compounds, Group III-VI semiconductor compounds, Group III-V semiconductor compounds, Group IV-VI semiconductor compounds, Group II-III-VI compounds, Group II-IV-VI compounds, Group II-IV-V compounds, alloys thereof and combinations thereof.

The Group II element may be Zn, Cd, Hg or a combination thereof; the Group III element may be Al, Ga, In, Ti or a combination thereof; and the Group IV element may be Si, Ge, Sn, Pb or a combination thereof. The Group V element may be P, As, Sb, Bi or a combination thereof; and the Group VI element may be O, S, Se, Te or a combination thereof.

The Group II-VI semiconductor compounds may be selected from the group consisting of binary compounds, e.g., CdSe, CdTe, ZnS, ZnSe, ZnTe, ZnO, HgS, HgSe and HgTe; ternary compounds, e.g., CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS and HgZnSe; and quaternary compounds, e.g., CdZnSeS, CdZnSeTe, CdZnSTe, CdHgSeS, CdHgSeTe, CdHgSTe, HgZnSeS, HgZnSeTe and HgZnSTe.

The Group III-V semiconductor compounds may be selected from the group consisting of binary compounds, e.g., GaN, GaP, GaAs, GaSb, AlN, AlP, AlAs, AlSb, InN, InP, InAs and InSb; ternary compounds, e.g., GaNP, GaNAs, GaNSb, GaPAs, GaPSb, AlNP, AlNAs, AlNSb, AlPAs, AlPSb, InNP, InNAs, InNSb, InPAs, InPSb, GaAlNP, AlGaN, AlGaP, AlGaAs, AlGaSb, InGaN, InGaP, InGaAs, InGaSb, AlInN, AlInP, AlInAs and AlInSb; and quaternary compounds, e.g., GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs and InAlPSb.

The Group IV-VI semiconductor compounds may be selected from the group consisting of binary compounds, e.g., SnS, SnSe, SnTe, PbS, PbSe and PbTe; ternary compounds, e.g., SnSeS, SnSeTe, SnSTe, PbSeS, PbSeTe, PbSTe, SnPbS, SnPbSe and SnPbTe; and quaternary compounds, e.g., SnPbSSe, SnPbSeTe and SnPbSTe.

The Group IV semiconductor compounds may be selected from the group consisting of unary compounds, e.g., Si and Ge; and binary compounds, e.g., SiC and SiGe.

In one exemplary embodiment, the semiconductor nanocrystals may have a core-shell structure. The shell may consist of one or more layers. In one exemplary embodiment, the shell may be composed of a Group II-VI semiconductor, a Group III-V semiconductor, a Group IV-VI semiconductor, or a combination thereof.

In one exemplary embodiment, the semiconductor nanocrystals may have a multilayer structure consisting of two or more layers composed of different materials. In one exemplary embodiment, the multilayer structure of the semiconductor nanocrystals may include at least one alloy interlayer composed of two or more different materials at the interface between the adjacent layers. In one exemplary embodiment, the alloy interlayer may be composed of an alloy having a composition gradient.

In accordance with another exemplary embodiment, there is provided an electronic device including the nanocrystal composite.

The device may be selected from the group consisting of light emitting diodes ("LEDs"), laser devices, memory devices, sensors, electroluminescent devices and photovoltaic devices In accordance with another exemplary embodiment, there is provided a color converting light emitting device that includes the nanocrystal composite.

Figure 2:
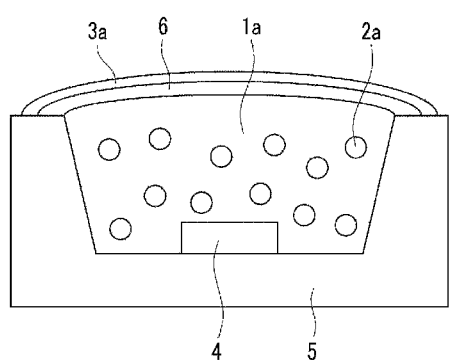
FIG. 2 is a cross-sectional view illustrating an exemplary embodiment of a color converting light emitting device.

FIG. 2 is a cross-sectional view illustrating an exemplary embodiment of the color converting light emitting device.

The color converting light emitting device may be fabricated by the following procedure. First, a silver (Ag) substrate 5 having a recessed portion is prepared. A light emitting diode chip 4, which emits light corresponding to a blue or UV region, is disposed on the substrate 5.

A matrix 1*a* containing semiconductor nanocrystals 2*a* is formed on the light emitting diode chip 4. For example, the semiconductor nanocrystals 2*a* may be red emitting nanocrystals, green emitting nanocrystals, blue emitting nanocrystals, or a mixture thereof. The matrix 1a may include an organic material, an inorganic material, or both. The matrix 1a contains the semiconductor nanocrystals 2a dispersed therein and is applied to the recessed portion of the substrate 5 to cover the light emitting diode chip 4. A polysiloxane resin and/or polyethylene terephthalate ("PET") may be applied to the light emitting diode chip 4 before the matrix 1a containing the semiconductor nanocrystals 2a is applied to the light emitting diode chip 4.

The semiconductor nanocrystals 2a absorb energy from the light emitting diode chip 4 and emit light of a wavelength that corresponds to the excitation energy of the nanocrystals 2a. The semiconductor nanocrystals 2a may emit light with various emission wavelengths and high color purity. For example, a white light emitting diode can be produced by combining red and green nanocrystals with a blue light emitting diode chip or by combining red, green and blue nanocrystals with a UV light emitting diode chip. The combination of nanocrystals that are capable of emitting light of various wavelengths and a light emitting diode chip can provide a light emitting diode capable of emitting light of various wavelengths.

In one exemplary embodiment, a functional layer 6 is formed on the matrix 1a. The functional layer 6 may contain an adhesive polymer and may consist of one or more sub-layers. Exemplary embodiments include configurations wherein the functional layer is omitted. Therefore, the formation of the functional layer 6 is optional and is not necessarily required.

A barrier layer 3a may be formed on the functional layer 6. The barrier layer 3a covers a portion or portions of the surface of the matrix 1a that may be exposed to oxygen, moisture, or both. The barrier layer 3a contains a polymer with low oxygen permeability, low moisture permeability, or both.

The explanation of FIG. 1 is applied to the configuration and constituent materials of the semiconductor nanocrystals 2a, the matrix 1a, the barrier layer 3a and the functional layer 6, and thus repeated explanation thereof is omitted.

In accordance with another exemplary embodiment, there is provided a current-driven light emitting device that includes the nanocrystal composite.

Figure 3:
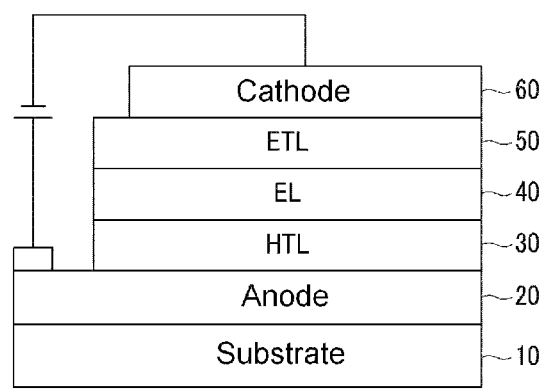
FIG. 3 is a cross-sectional view illustrating an exemplary embodiment of a current-driven light emitting device.

FIG. 3 is a cross-sectional view illustrating an exemplary embodiment of the current-driven light emitting device.

The current-driven light emitting device may be an organic light emitting diode ("OLED"). A general organic light emitting diode has a structure in which an organic emission layer is formed between two electrodes. An organic light emitting diode utilizes the principle that electrons injected from one of the electrodes and holes injected from the other electrode combine together in the organic emission layer to form excitons, which emit light of various colors when they decay from the excited state to the ground state.

In the current-driven light emitting device, an anode 20 is disposed on an organic substrate 10. The anode 20 may be made of a high work function material that allows holes to be injected thereinto. For example, the anode material may be a transparent oxide such as indium tin oxide ("ITO"), indium oxide, or other materials having similar characteristics.

In one exemplary embodiment, a hole transport layer ("HTL") 30, an emission layer ("EL") 40 and an electron transport layer ("ETL") 50 are sequentially formed on the anode 20. The hole transport layer 30 may contain a p-type semiconductor, and the electron transport layer 50 may contain an n-type semiconductor or a metal oxide. The emission layer 40 contains an exemplary embodiment of the nanocrystal composite.

A cathode 60 is disposed on the electron transport layer 50. The cathode 60 may be made of a low work function material to facilitate the injection of electrons thereinto. Examples of the cathode material include, but are not limited to, metals, such as magnesium, calcium, sodium, potassium, titanium, indium, yttrium, lithium, gadolinium, aluminum, silver, tin, lead, cesium, barium, alloys thereof, and mixtures thereof; and multilayer materials, such as LiF/Al, LiO$_2$/Al, LiF/Ca, LiF/Al and BaF$_2$/Ca. Methods for the formation of the constituent electrodes and layers and methods for the fabrication of the display device are widely known in the art, and thus their detailed description is omitted herein.

A more detailed description of exemplary embodiments will be described with reference to the following examples. However, these examples are given merely for the purpose of illustration and are not to be construed as limiting the scope of the exemplary embodiments.

EXAMPLES

Example 1

One (1) milliliter (mL) of a polysiloxane resin is mixed with a chloroform solution of green nanocrystals (CdSe/CdSZnS). The chloroform is completely removed under vacuum to prepare a nanocrystal composite. A blue (445 nm) light emitting diode chip is mounted in a recessed portion of a silver (Ag) substrate. Five (5) microliters (μl) of a polysiloxane resin is applied to cover the blue light emitting diode chip. The resulting structure is stored in an oven at 150° C. for 1 hour while maintaining a constant temperature. The structure is then cooled to room temperature. Next, 15 μl of the nanocrystal composite solution is applied to the cured polysiloxane resin to form a coating with uniform thickness. The resulting structure is stored in an oven at 150° C. for 1 hour while maintaining a constant temperature. The structure is then cooled to room temperature to complete the fabrication of the light emitting diode.

Next, 0.25 grams (g) of polyvinyl alcohol (weight average molecular weight ($M_w$)=2,000) is completely dissolved by stirring the polyvinyl alcohol in 5 mL of water at 80° C. The solution is then applied to the light emitting diode. The resulting structure is stored in an oven at 100° C. for 1 hour while maintaining a constant temperature. The structure is then cooled to room temperature to form a barrier layer on the light emitting diode.

Example 2

A light emitting diode is fabricated in the same manner as in Example 1, except that 0.025 g of green nanocrystals (CdSe/CdSZnS)-silica composites are finely ground and mixed with 0.5 mL of a polysiloxane resin. The resulting mixture is then de-aired to prepare a nanocrystal composite that is applied to the cured polysiloxane resin.

Example 3

A light emitting diode is fabricated in the same manner as in Example 2, except that a polyethylene terephthalate ("PET") film is placed on the 5 μl of the polysiloxane resin covering the blue light emitting diode chip and the resulting structure is stored in an oven at 150° C. for 1 hour while maintaining a constant temperature.

Example 4

A light emitting diode is fabricated in the same manner as in Example 1, except that 0.2 mL of a chloroform (5 ml)

solution of polystyrene ($M_w$=200,000, 0.1 g) is applied to the polysiloxane resin/nanocrystals composite of the light emitting diode and cured in an oven at 80° C. for 1 hour to form a barrier layer.

Comparative Example 1

A light emitting diode is fabricated in the same manner as in Example 1, except that the application of the polyvinyl alcohol solution and the oven curing are not performed.

Comparative Example 2

A light emitting diode is fabricated in the same manner as in Example 2, except that the application of the polyvinyl alcohol solution and the oven curing are not performed.

Comparative Example 3

A light emitting diode is fabricated in the same manner as in Example 3, except that the application of the polyvinyl alcohol solution and the oven curing are not performed.

Measurements of Power Conversion Efficiency

Figure 4:
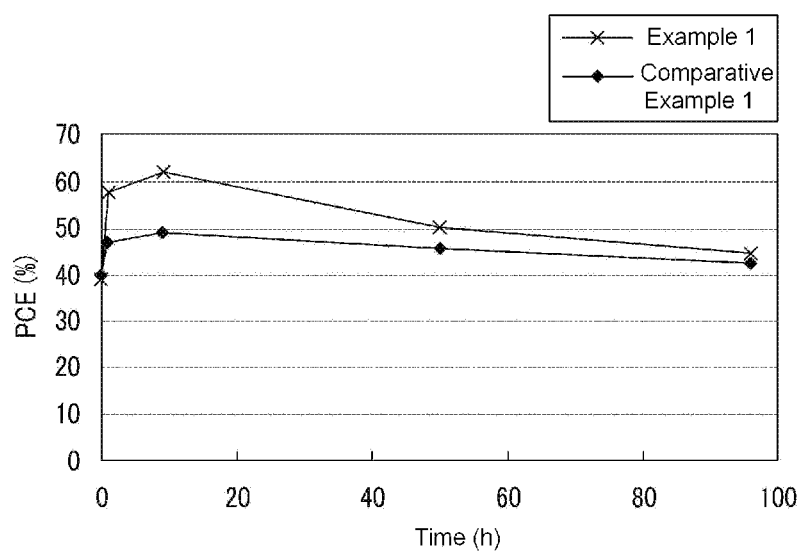
FIG. 4 is a graph showing changes in the power conversion efficiency ("PCE", percentage, (%)) versus time (hours, (h)) of display devices fabricated in accordance with Example 1 and Comparative Example 1.
Figure 5:
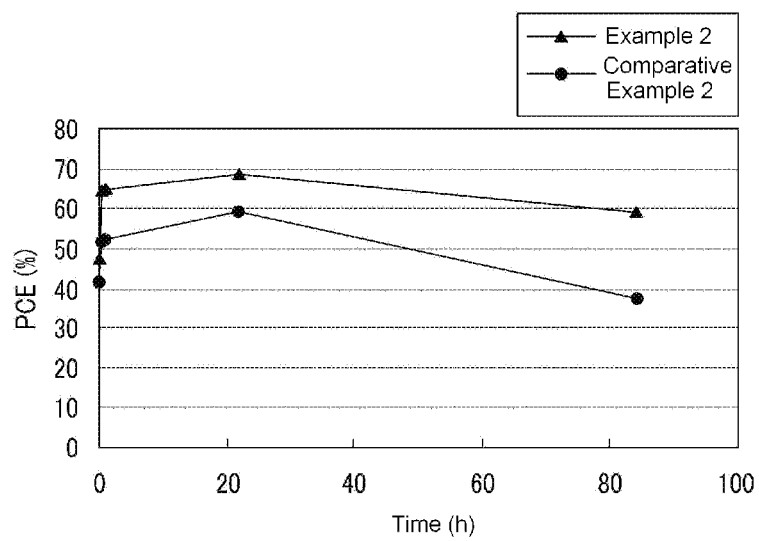
FIG. 5 is a graph showing changes in the power conversion efficiency (%) versus time (h) of display devices fabricated in accordance with Example 2 and Comparative Example 2.
Figure 6:
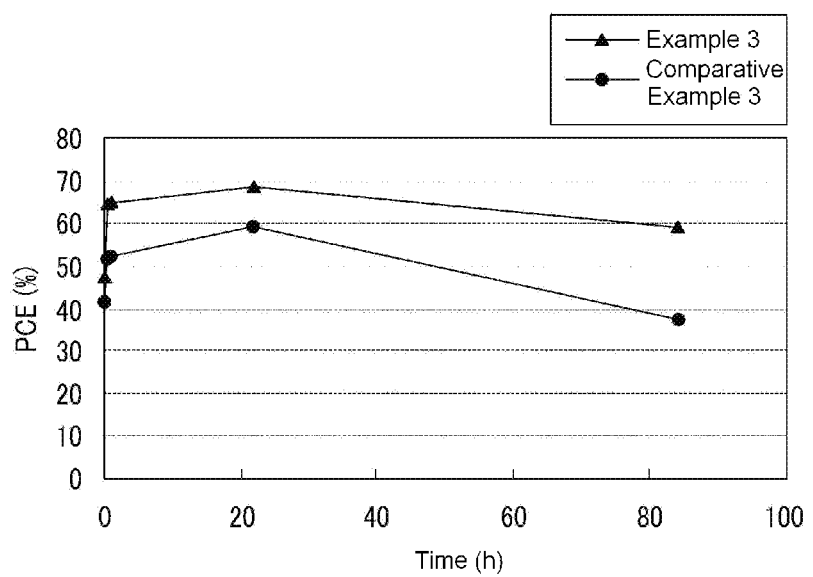
FIG. 6 is a graph showing changes in the power conversion efficiency (%) versus time (h) of display devices fabricated in accordance with Example 3 and Comparative Example 3.

The light emitting diodes fabricated in Examples 1-3 and Comparative Examples 1-3 are measured for power conversion efficiency as a function of time while being operated at 20 milliamperes (mA). The results are shown in FIGS. 4-6. FIG. 4 is a graph showing changes in the power conversion efficiency ("PCE", %) versus time (h) of the display devices fabricated in accordance with Example 1 and Comparative Example 1. FIG. 5 is a graph showing changes in the power conversion efficiency ("PCE", %) versus time (h) of the display devices fabricated in accordance with Example 2 and Comparative Example 2. FIG. 6 is a graph showing changes in the power conversion efficiency ("PCE", %) versus time (h) of the display devices fabricated in accordance with Example 3 and Comparative Example 3. The graphs of FIGS. 4, 5 and 6 reveal that the presence of the barrier layers ensures a more stable operation of the light emitting diodes with higher power conversion efficiency over a longer period of time.

As is apparent from the foregoing, the exemplary embodiments of the semiconductor nanocrystal composite prevent moisture, oxygen, or both from permeating thereinto to ensure stability and long-term operation of applied devices while maintaining the inherent characteristics of semiconductor nanocrystals.

Although exemplary embodiments have been described herein with reference to the foregoing embodiments, those skilled in the art will appreciate that various modifications and changes are possible without departing from the spirit of the disclosure as disclosed in the accompanying claims. Therefore, it is to be understood that such modifications and changes are encompassed within the scope of the disclosure.

What is claimed is:

1. A nanocrystal composite comprising
   a matrix including a plurality of semiconductor nanocrystals,
   a barrier layer disposed on at least a portion of the surface of the matrix and including a polymer with low oxygen permeability, low moisture permeability, or both, and
   at least one functional layer disposed under at least a portion of the barrier layer,
   wherein the polymer with low oxygen permeability comprises a polymer having an oxygen permeability of not higher than about 10,000 mL/m²/day at a relative humidity of 0% or not higher than about 100,000 mL/m²/day at a relative humidity of 90%, and
   wherein the polymer with low moisture permeability comprises a polymer having a moisture permeability of not higher than about 10,000 g/m²/day at a relative humidity of 90%, and
   wherein the functional layer comprises an adhesive polymer selected from the group consisting of polyethylene, polypropylene, polystyrene, a copolymer thereof, and a mixture thereof.

2. The nanocrystal composite of claim 1, wherein the polymer is transparent, hydrophobic, or both.

3. The nanocrystal composite of claim 1, wherein the polymer is prepared by polymerizing one or more monomers.

4. The nanocrystal composite of claim 1, wherein the polymer is selected from the group consisting of polyolefin, polyester, polyamide, polyvinyl chloride, polyvinyl alcohol, polyvinylidene chloride, polystyrene, polyacrylate, poly (ethylene-vinyl alcohol), poly(ethylene-vinyl chloride), poly (vinylidene chloride-styrene), poly(vinylidene chloride-vinyl chloride), a copolymer thereof, and a mixture thereof.

5. The nanocrystal composite of claim 1, wherein the barrier layer has a thickness of about 10 nm to about 100 μm.

6. The nanocrystal composite of claim 1, wherein the sum of the thicknesses of the barrier layer and the functional layer is between about 10 nm and about 100 μm.

7. The nanocrystal composite of claim 1, wherein the matrix includes an organic material, an inorganic material, or both.

8. The nanocrystal composite of claim 1, wherein the semiconductor nanocrystals are selected from the group consisting of Group II-VI semiconductor compounds, Group II-V semiconductor compounds, Group III-VI semiconductor compounds, Group III-V semiconductor compounds, Group IV-VI semiconductor compounds, Group II-III-VI compounds, Group II-IV-VI compounds, Group II-IV-V compounds, alloys thereof, and any combinations thereof.

9. The nanocrystal composite of claim 1, wherein the semiconductor nanocrystals have a core-shell structure.

10. An electronic device comprising the nanocrystal composite of claim 1.

11. The electronic device of claim 10, wherein the device is selected from the group consisting of light emitting diodes, laser devices, memory devices, sensors, electroluminescent devices and photovoltaic devices.

12. The electronic device of claim 11, wherein the light emitting diode is a color converting light emitting device.

* * * * *